United States Patent [19]
Horn et al.

[11] Patent Number: 5,411,599
[45] Date of Patent: May 2, 1995

[54] THERMOELECTRIC DEVICE UTILIZING NANOPOROUS MATERIAL

[75] Inventors: Stuart B. Horn, Fairfax; Elizabeth H. Nelson, Springfield, both of Va.

[73] Assignee: The United States of America as represented the Secretary of the Army, Washington, D.C.

[21] Appl. No.: 227,741

[22] Filed: Apr. 12, 1994

Related U.S. Application Data

[62] Division of Ser. No. 122,981, Sep. 20, 1993.

[51] Int. Cl.$^6$ ..................... H01L 35/00; H01L 35/02; H01L 35/04
[52] U.S. Cl. .................................... 136/203; 257/930; 136/236.1
[58] Field of Search ............. 257/930; 136/203, 236.1, 136/238, 239, 240, 241

[56] References Cited

U.S. PATENT DOCUMENTS

| | | | |
|---|---|---|---|
| 3,524,771 | 8/1970 | Green | 136/203 |
| 3,602,721 | 8/1971 | Nakamura et al. | 257/930 |
| 5,006,505 | 4/1991 | Skertic | 257/930 |

OTHER PUBLICATIONS

Dagani, Ron; "Nanostructured Materials Promise to Advance Range of Technologies"; Chemical and Engineering News; 23 Nov. 1992.

*Primary Examiner*—William D. Larkins
*Assistant Examiner*—S. V. Clark
*Attorney, Agent, or Firm*—Milton W. Lee; Alain L. Bashore; Anthony T. Lane

[57] ABSTRACT

A nanoporous semiconductor material and fabrication technique for use as thermoelectric elements. Starting precursors are mixed in solution so as to thoroughly dissolve in solution which is then reduced. A second phase may be added in solution to provide nanoinclusions which may be subsequently removed. A nanoporous semiconductor is formed whereby lattice thermal conductivity is greatly reduced, due to enhanced phonon scattering on the order of 10 W/cm·°K. The nanoporous semiconductor material may be used as the n- and p- legs in a Peltier couple utilized for a thermoelectric cooler, a cryogenic cooler, thermoelectric power generator, or a thermoelectric heat pump.

2 Claims, 2 Drawing Sheets

THERMOELECTRIC DEVICE UTILIZING NANOPOROUS MATERIAL

This application is a division of application Ser. No. 08/122,981, filed 20 Sep. 1993, pending.

BACKGROUND OF THE INVENTION

1. Field of the Invention

The present invention generally relates to semiconductor thermoelectric elements and more specifically, to a nanoporous semiconductor material and fabrication technique for use as thermoelectric elements.

2. Description of Prior Art

The basic component of the modern thermoelectric device utilizes semiconductors in what is called the Peltier Couple. The Peltier Couple essentially consists of metallic conductors (which ideally exhibit negligible thermoelectric effects) which are coupled through a doped n-type and p-type semiconductor. The nature of the semiconductors allow for a larger energy to be released or required due to changes in transport energy as electrons move between metal to semiconductor and back again. The usefulness of a particular material resides for the most part on three material properties: Seebeck coefficient S, electrical resistivity $\rho$, and thermal conductivity k.

Ideally, thermoelectric materials must exhibit high electrical conductivity and low thermal conductivity. The usefulness of any thermoelectric material can be described by a figure-of-merit (Z) expressed as:

$$Z = \alpha^2 \sigma/\kappa$$

where $\alpha$ is the Seebeck coefficient, $\sigma$ is the electrical conductivity, and $\kappa$ is the total thermal conductivity, a sum of lattice and electronic components. The $\alpha$ term decreases with increases of the free-carrier concentration, which is the opposite of electrical conductivity. The optimum free-carrier concentration to maximize Z in bulk thermoelectric material is such that the material becomes degenerately doped, which is about $10^{19}$ cm$^{-3}$. Semiconductor materials (with band gaps that are optimized for operating temperature) are considered ideal thermoelectric materials compared to metals or insulators.

Multiple stage thermoelectric devices (consisting of mating couples to form individual stages) are designed where energy from one stage is used as input to the next stage so that a larger temperature difference is attainable. No viable device has yet been developed since there awaits in the prior art the development of thermoelectric materials with higher FOMs than are presently available. An example of this non-viability is shown in discussing thermoelectric for cryogenic coolers used in thermal image detectors.

A thermal image detector of either the cooled or uncooled type is required to be isolated from random noise and have been proposed by structural modifications of the material structure. Experimental thermal isolation support structures have been proposed for uncooled thermal detectors utilizing aerogels, which are oxide containing sol-gels derived materials, supercritically dried with porosities up to 98%. A cooled detector is required to be at very low operating temperatures so as to detect minute background temperature variations, whereby the low temperature performs the "isolate" type function. Experimental thermoelectric materials have been attempted for use in thermoelectric cryogenic coolers of cooled detectors which are made of n and p-type Bi$_2$Te$_3$ material with the appropriate dopant. At present, the best FOM values for semiconductivity are slightly greater than $3 \times 10^{-3}/°$K. In order to reach cryogenic temperatures (120° K. or lower) with a coefficient-of performance of at least 1%, a FOM of $10^{-2}/°$K. for both n and p legs must be found.

While the prior art has reported using semiconductor thermoelectric elements none have established a basis for a specific material and fabrication technique that is dedicated to the task of resolving the particular problem at hand.

What is needed in this instance is a radically new approach to structural modification of thermoelectric materials and their technique of fabrication so as to produce higher FOMs to make thermoelectric devices practical.

SUMMARY OF THE INVENTION

It is therefore one object of the invention to provide a technique for fabricating a new type of semiconductor material for use as a thermoelectric element.

According to the invention, there is disclosed a nanoporous semiconductor material and fabrication technique for use as thermoelectric elements. Starting precursors are mixed in solution so as to thoroughly dissolve in solution which is then dried. A second phase may be added in solution to provide nanoinclusions which may be subsequently removed. A nanoporous semiconductor is formed whereby lattice thermal conductivity is greatly reduced, due to enhanced phonon scattering on the order of 10 Watts/cm·°K. Increased performance can be additionally achieved by fabricating the contact ends of the body as a solid, and by additional doping after fabrication.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Improved carrier mobilities permit lowering the optimum free-carrier concentrations in thermoelectric materials. This leads to enhanced Seebeck coefficients, a smaller electronic component to thermal conductivity and higher Z values. This is especially meaningful when lattice conductivity is lowered by structural modifications with nanotechnology. Nanostructured materials include building blocks on the order of nanometers ($10^{-9}$ meters) or tens of nanometers. A more thorough discussion of nanostructured materials may be found in "Nanostructured Materials Promise to Advance Range of Technologies" by Ron Dagani in Chemical and Engineering News, 23 Nov. 1992; pages 18–24; incorporated herein by reference. Porosity is defined according to the equation:

$$P = 1 - \rho'/\rho$$

where $\rho$ is density of the material free from pores and $\rho'$ is its bulk density (including the pores). In place of porosity, use is sometimes made of relative density, i.e. fraction of the actual density of the solid: $\rho'/\rho = 1 - P$. Porosity is also expressed in percent ($P \times 100$).

Figure 1:
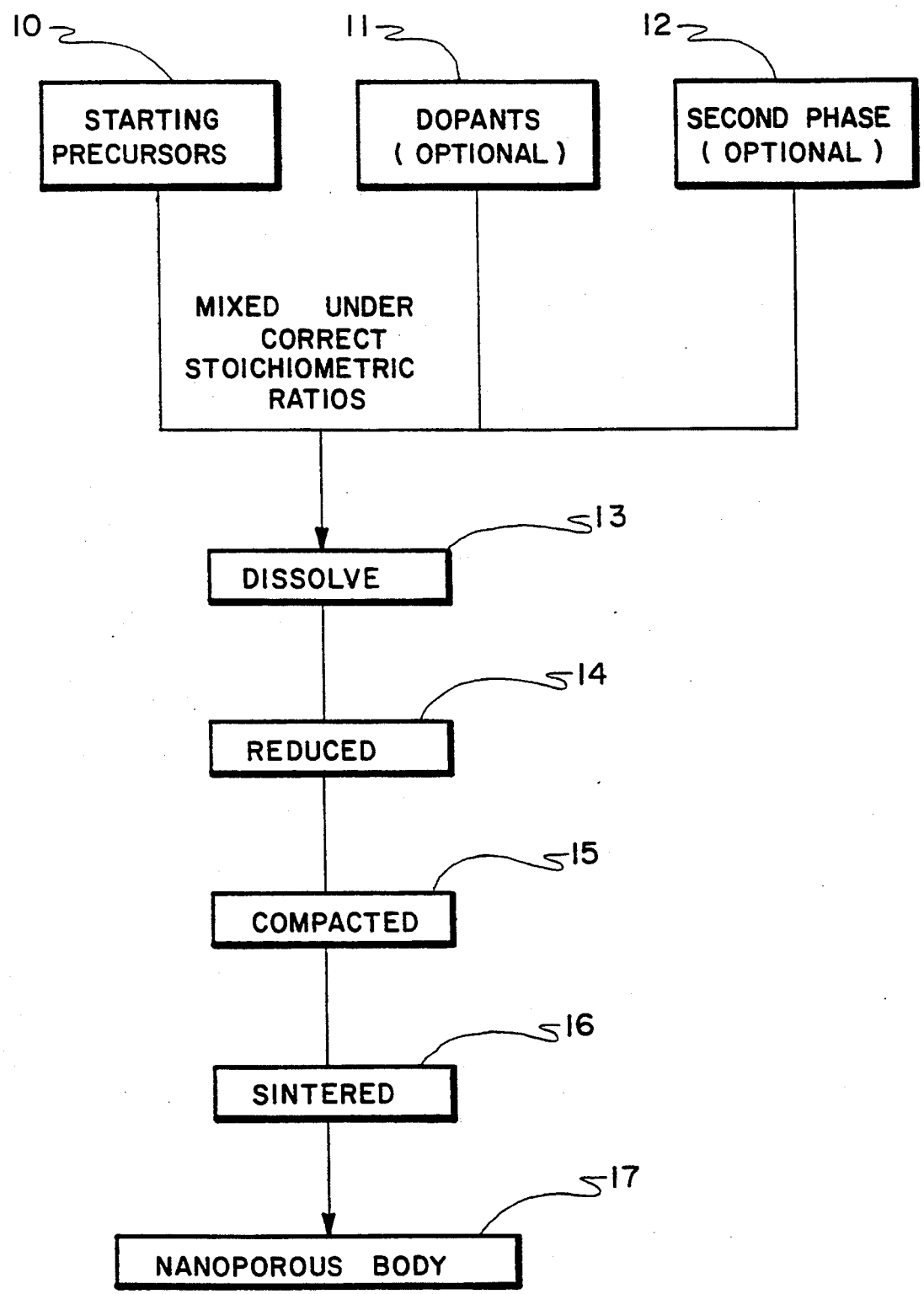
FIG. 1 is a block diagram of the overall fabrication technique of the preferred embodiment.

Referring now to the drawings, and more particularly to FIG. 1, there is shown in block diagram the steps of the preferred embodiment for the fabrication technique of the present invention. The thermoelectric element is grown using an aqueous solution coprecipitation to form a nanoporous structure utilizing optional dopants and second phases so as to provide a lattice thermal conductivity reduced several orders of magnitude with a small rise in electrical resistivity due to enhanced phonon scattering. Starting precursors 10 including optional second phase 12 and/or dopants 11 are mixed in solution at the molecular level with the correct stoichiometric ratios. The solvent to be used must be common to all elements or compounds used in the process in step 13. Elements and any optional dopants/second phases are mixed in solution at the molecular level and are reacted at ambient temperature in step 13 that are reduced in step 14 with heat to give a pure compound in a fine particulate which is compacted in step 15 using very high pressure and sintered in step 16 to yield a nanoporous body in step 17. It is understood that the invention is not limited to the specific technique by which the nanoporous semiconductor structure is grown. The general concept of phonon scattering is more thoroughly discussed in U.S. Pat. No. 3,524,771 to Green, issued on 18 Aug. 1970.

A nanoporous semiconductor is formed whereby lattice thermal conductivity is greatly reduced due to enhanced phonon scattering on the order of 10 W/cm.°K. Selection of elements from the periodic table for the thermoelectric elements and for additional phases, is not limited to any specific material precursors, dopants or second phases but that any precursor, dopant and/or second phase may be utilized for this invention to form a material having nanoporosity or nanoinclusions which may or may not be removed. Nanoinclusion is defined as a solid, liquid or gaseous foreign body on the order of $10^{-9}$ meters enclosed in a solid material. The use of the appropriate second phase addition will induce the scatter of even more phonons. The removal of the second phase which will add voids in the material structure can also give the same effect. The aforementioned technique will yield a thermoelectric element consisting of a nanoporous material having a greatly reduced lattice thermal conductivity due to increased phonon scattering on the order of 10 W/cm·°K.

In the preferred embodiment, Bismuth and Telluride are the thermoelectric growth elements utilized. The thermoelectric element growth process may be described as an aqueous solution coprecipitation process of mixed bismuth/tellurium oxides and hydroxides. A 0.0687 Molar solution of Bismuth and a 1.02 Molar solution of Tellurium are chemically reacted with a nitrate solution at ambient temperature which results in a white particulate. The following reaction results in a fine black particulate:

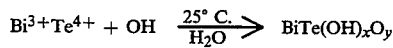

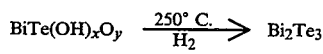

The particulate is pressed and sintered at 345 C. using a compaction pressure of 2.0 GPA. The result is a clear pellet of bismuth telluride.

Bismuth Telluride based alloy materials can also be synthesized in an alternative process from molecular precursors derived by molecular chemical co-precipitation with compounds such as $Bi_{0.5}Sb_{1.5}Te_3$ and $Bi_2Te_{3-}Fe_{0.1}$ etc. This second phase process can introduce nanoinclusions into the resultant Bismuth Telluride which may or may not be removed to create porosity. The Bismuth Telluride Alloy Precursor is made by the following reaction:

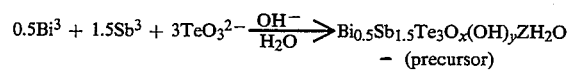

and the Bismuth Telluride Composite System is made by the following reaction:

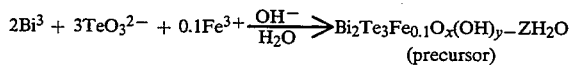

Figure 2:
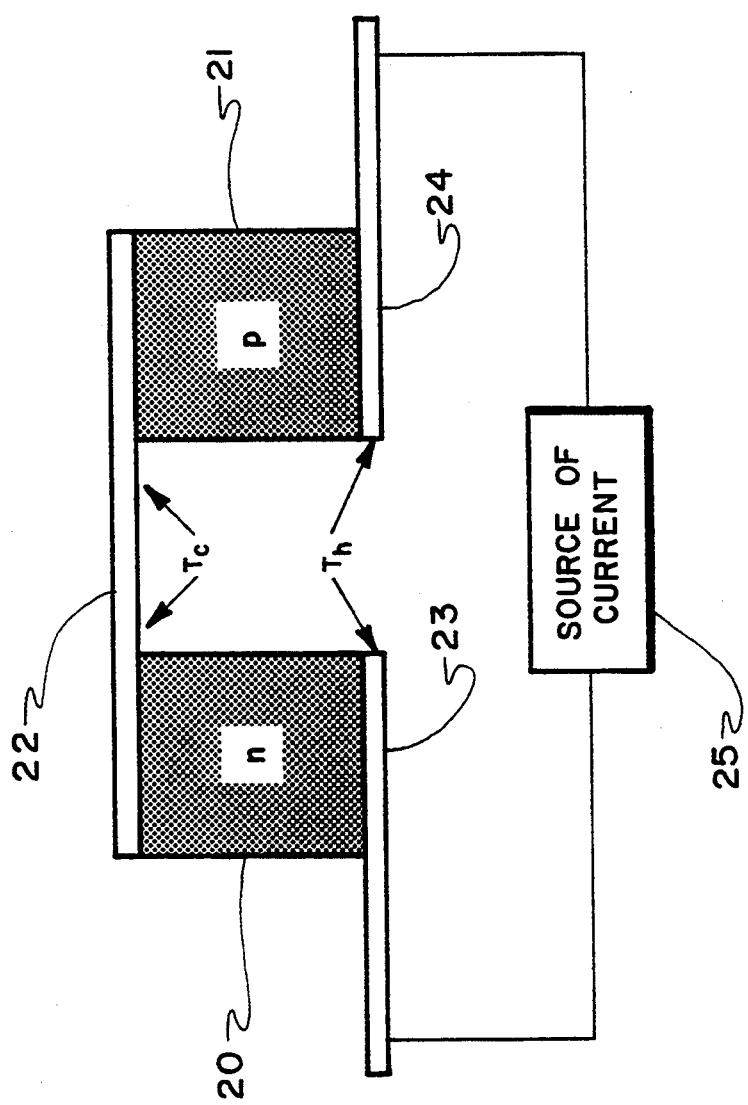
FIG. 2 is a schematic diagram of a peltier heat pump utilizing the thermoelectric material of the preferred embodiment.

FIG. 2 is a schematic diagram of a peltier couple utilizing the thermoelectric material where n leg 20 and p leg 21 represent n-type and p-type nanoporous semiconductor structures, respectively. Legs 20 and 21 are connected by metallic conductors which exhibit negligible thermoelectric effects. Conductor 22 is coupled to one side each of both legs 20 and 21. Conductors 23 and 24 are coupled to the other side respectively of each leg 20 and 21. Current source 25 is coupled to each of conductors 23 and 24. In the operation as a cooler, a current is passed from leg 20 to nonthermoelectric conductor 22 removes heat from conductor 22 at a temperature $T_c$. When operated as a heater, current is passed from leg 21 to conductors 23 and 24 at a temperature $T_h$. In both cases reversing the current will cause the heat to flow the other way.

To increase the performance of the nanoporous body, several supplemental steps may be included during fabrication. The contact ends of legs 20 and 21 may be solid instead of nanoporous which allows the junctions between the nanoporous material of legs 20 and 21 and conductors 22, 23, and 24 to conduct electricity and heat with as little impedance as possible so as to not affect the thermoelectric effect at the junction.

Multiple stage thermoelectric devices (consisting of mating couples to form individual stages) are then designed where energy from one stage is used as input to the next stage so that a larger temperature difference is attainable. The stages comprise a device which may be designed for cooling, heating, or power generation. Such devices which use nanoporous semiconductors as thermoelectric elements could be used to fabricate coolers for use in cryogenics, air conditioning, refrigeration, and thermoelectric power generators. A cryogenic cooler utilizing the device shown in FIG. 2 with nanoporous semiconductors as the thermoelectric elements allows such a device to be viable. The currently available cooler in the Prior Art achieves a maximum temperature difference of about 150 degrees Celsius resulting in a possible minimum attainable temperature of approximately 150 degrees Kelvin. With the present invention, a minimum attainable temperature (for a FOM of $10^{-2}/°K$.) of at least 75 degrees Kelvin is achieved, thus making a cryogenic cooler practical with this significant improvement in the art.

While this invention has been described in terms of the preferred embodiment consisting of a thermoelectric device, those skilled in the art will recognize that the invention can be practiced with modification within the spirit and scope of the appended claims.

We claim:

1. In a thermoelectric device, a semiconductor utilized as the n- and p- legs of a peltier couple, comprising:
   a nanoporous structure whereby lattice thermal conductivity is greatly reduced, due to enhanced phonon scattering on the order of 10 W/cm·°K.

2. The semiconductor of claim 1 wherein contact ends of said structure is fabricated as a solid.

* * * * *